(12) United States Patent
Shimada et al.

(10) Patent No.: US 9,095,882 B2
(45) Date of Patent: Aug. 4, 2015

(54) PIEZOELECTRIC DEVICE, DUST REMOVING APPARATUS, AND IMAGING APPARATUS

(71) Applicant: CANON KABUSHIKI KAISHA, Tokyo (JP)

(72) Inventors: Akira Shimada, Saitama (JP); Yutaka Maruyama, Tokyo (JP); Toshihiro Ifuku, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 215 days.

(21) Appl. No.: 13/655,804

(22) Filed: Oct. 19, 2012

(65) Prior Publication Data

US 2013/0100531 A1   Apr. 25, 2013

(30) Foreign Application Priority Data

| Oct. 20, 2011 | (JP) | ................................ | 2011-230368 |
| Mar. 16, 2012 | (JP) | ................................ | 2012-060202 |
| Aug. 9, 2012 | (JP) | ................................ | 2012-177562 |
| Aug. 29, 2012 | (JP) | ................................ | 2012-188984 |

(51) Int. Cl.
| G02B 1/00 | (2006.01) |
| B08B 7/02 | (2006.01) |
| G02B 27/00 | (2006.01) |
| H01L 41/187 | (2006.01) |

(52) U.S. Cl.
CPC ............ B08B 7/028 (2013.01); G02B 27/0006 (2013.01); G03B 2205/0061 (2013.01); G03B 2205/0092 (2013.01); H01L 41/1871 (2013.01)

(58) Field of Classification Search
CPC ...... B60Q 1/2665; B60R 1/1207; B60R 1/12; B60R 1/0602; B60R 1/06; G02B 27/0006; B08B 7/028

USPC .................................................. 359/507, 508
See application file for complete search history.

(56) References Cited

U.S. PATENT DOCUMENTS

| 2009/0002541 A1* | 1/2009 | Niwamae ...................... 348/335 |
| 2009/0153966 A1 | 6/2009 | Matsumoto |
| 2012/0019108 A1 | 1/2012 | Tanaka et al. |

FOREIGN PATENT DOCUMENTS

| CN | 1979908 A | 6/2007 |
| CN | 101295762 A | 10/2008 |
| CN | 101840132 A | 9/2010 |
| CN | 102035431 A | 4/2011 |
| DE | 102004063818 A1 | 7/2006 |
| EP | 1796266 A2 | 6/2007 |
| EP | 1986245 A2 | 10/2008 |
| EP | 2228982 A1 | 9/2010 |
| EP | 2251313 A1 | 11/2010 |

(Continued)

*Primary Examiner* — Euncha Cherry
(74) *Attorney, Agent, or Firm* — Canon U.S.A. Inc., IP Division

(57) ABSTRACT

A piezoelectric device includes an elastic member, an electrical-mechanical energy conversion element fixed to the elastic member, configured to cause the elastic member to generate vibration, and a supporting member that supports the elastic member. The electrical-mechanical energy conversion element is formed of a piezoelectric material in which, in a usage temperature range of the piezoelectric device, a piezoelectric constant decreases along with temperature rise. A supporting member that supports the elastic member is formed of a material in which, in the usage temperature range of the piezoelectric device, Q value increases along with temperature rise.

11 Claims, 9 Drawing Sheets

(56) References Cited

FOREIGN PATENT DOCUMENTS

| EP | 2301770 A2 | 3/2011 |
| JP | 2007-259700 A | 10/2007 |
| JP | 2009-215111 A | 9/2009 |
| WO | 2010/134604 A1 | 11/2010 |

* cited by examiner

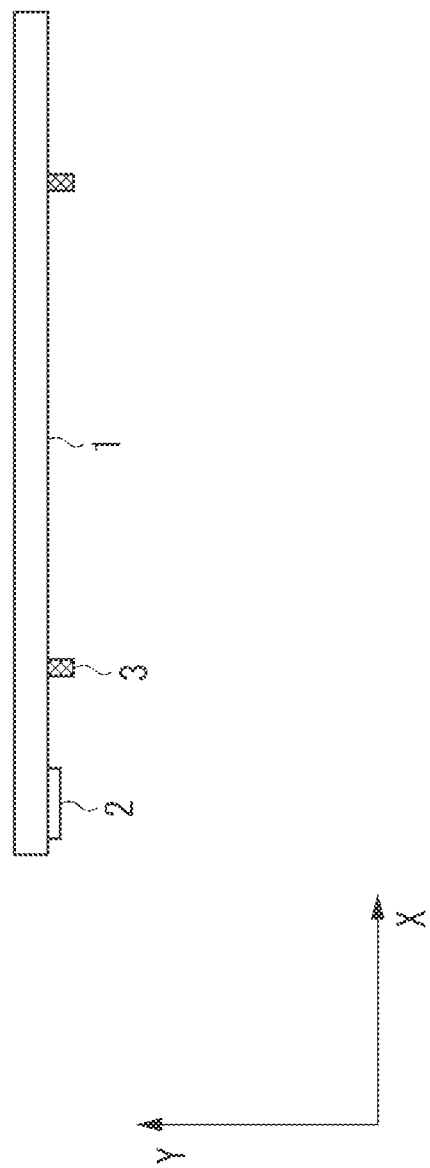

PIEZOELECTRIC DEVICE, DUST REMOVING APPARATUS, AND IMAGING APPARATUS

BACKGROUND OF THE INVENTION

1. Field of the Invention

The present invention relates to a piezoelectric device, a dust removing apparatus, and an imaging apparatus which use an electrical-mechanical energy conversion element (representatively, piezoelectric element).

2. Description of the Related Art

A piezoelectric material is a substance which has a direct piezoelectric effect in which an electric polarization occurs when distortion is applied, and conversely, an converse piezoelectric effect in which distortion occurs when an electric field is applied. The piezoelectric material is used for piezoelectric devices such as various types of sensors, filters, and actuators by utilizing the property that such a reversible conversion between electrical energy and mechanical energy is possible. Major types of these piezoelectric materials which have been used for the conventional devices contain lead, and for example as a representative one, there is lead zirconate titanate obtained by solid solutions of $PbTiO_3$ and $PbZrO_3$ having $ABO_3$ type perovskite structure. Because the lead zirconate titanate has superior piezoelectric characteristics, and good temperature characteristics, it is utilized in a wide variety of regions. However, in recent years, there has been increasing concern over adverse influence of lead on the human body. In each country, the use of lead for glass or high-temperature soldering begins to be restricted in accordance with RoHS Directive or the like. For this reason, even in piezoelectric materials used for various types of devices, non-lead materials which do not use lead are sought as an alternative to existing materials.

One of non-lead piezoelectric materials which are now under development is barium titanate ($BaTiO_3$). The barium titanate has relatively high piezoelectric characteristics among non-lead piezoelectric materials, but there is a problem that crystal structure undergoes a phase transition from orthorhombic to tetragonal at close to room temperature, and causes marked change to the characteristics at product usage temperature region.

As one of measures for dropping an orthorhombic-tetragonal structure phase transition temperature (Tr) which exists at close to room temperature from a temperature close to the room temperature, a method for adding a minute amount of calcium titanate ($CaTiO_3$) is taken. Japanese Patent Application Laid-Open 2009-215111 discusses that, when the minute amount of such the $CaTiO_3$ is added, the phase transition temperature is sequentially shifted to low temperature side according to the additive amount of calcium titanate to barium titanate.

However, the above-described conventional example has the following issues. Specifically, even when the minute amount of calcium titanate is added to barium titanate as in the above-described conventional example, the phase transition temperature still exists at close to driving temperature of the device. Therefore, variation of the piezoelectric constant with temperature remains great as compared with the lead-based piezoelectric material. More specifically, as temperature changes from the room temperature to a low temperature, the piezoelectric constant increases. When such the piezoelectric material is applied to an actuator or the like, there arises a problem that as temperature changes from the room temperature to a low temperature, displacement increases. Therefore, conventionally in order to correct variation of displacement of the piezoelectric actuator with temperature, it is necessary to detect temperature or displacement, and to control the displacement based on driving frequency or applied voltage.

SUMMARY OF THE INVENTION

The present invention is directed to providing a piezoelectric device capable of achieving enhancement of temperature stability, without the need for a unit that detects temperature or displacement.

According to an aspect of the present invention, a piezoelectric device includes an elastic member, an electrical-mechanical energy conversion element fixed to the elastic member, configured to cause the elastic member to generate vibration, and a supporting member that supports the elastic member. The electrical-mechanical energy conversion element is formed of a piezoelectric material in which, in a usage temperature range of the piezoelectric device, a piezoelectric constant decreases along with temperature rise. A supporting member that supports the elastic member is formed of a material in which, in the usage temperature range of the piezoelectric device, Q value increases along with temperature rise.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIGS. 1A, and 1B illustrate a configuration example of a dust removing apparatus according to a first exemplary embodiment of the present invention, and FIG. 1A and FIG. 1B are a plan view and a side view respectively.

DESCRIPTION OF THE EMBODIMENTS

Various exemplary embodiments, features, and aspects of the invention will be described in detail below with reference to the drawings.

A first exemplary embodiment will be described. A configuration example of a dust removing apparatus configured using a piezoelectric device to which the present invention is applied, as the first exemplary embodiment, will be described with reference to FIG. 1. The piezoelectric device according to the exemplary embodiment includes an elastic member, a piezoelectric element serving as an electrical-mechanical energy conversion element that is fixed to the elastic member, and causes the elastic member to generate vibration, and a supporting member that supports the elastic member.

Figure 1A:
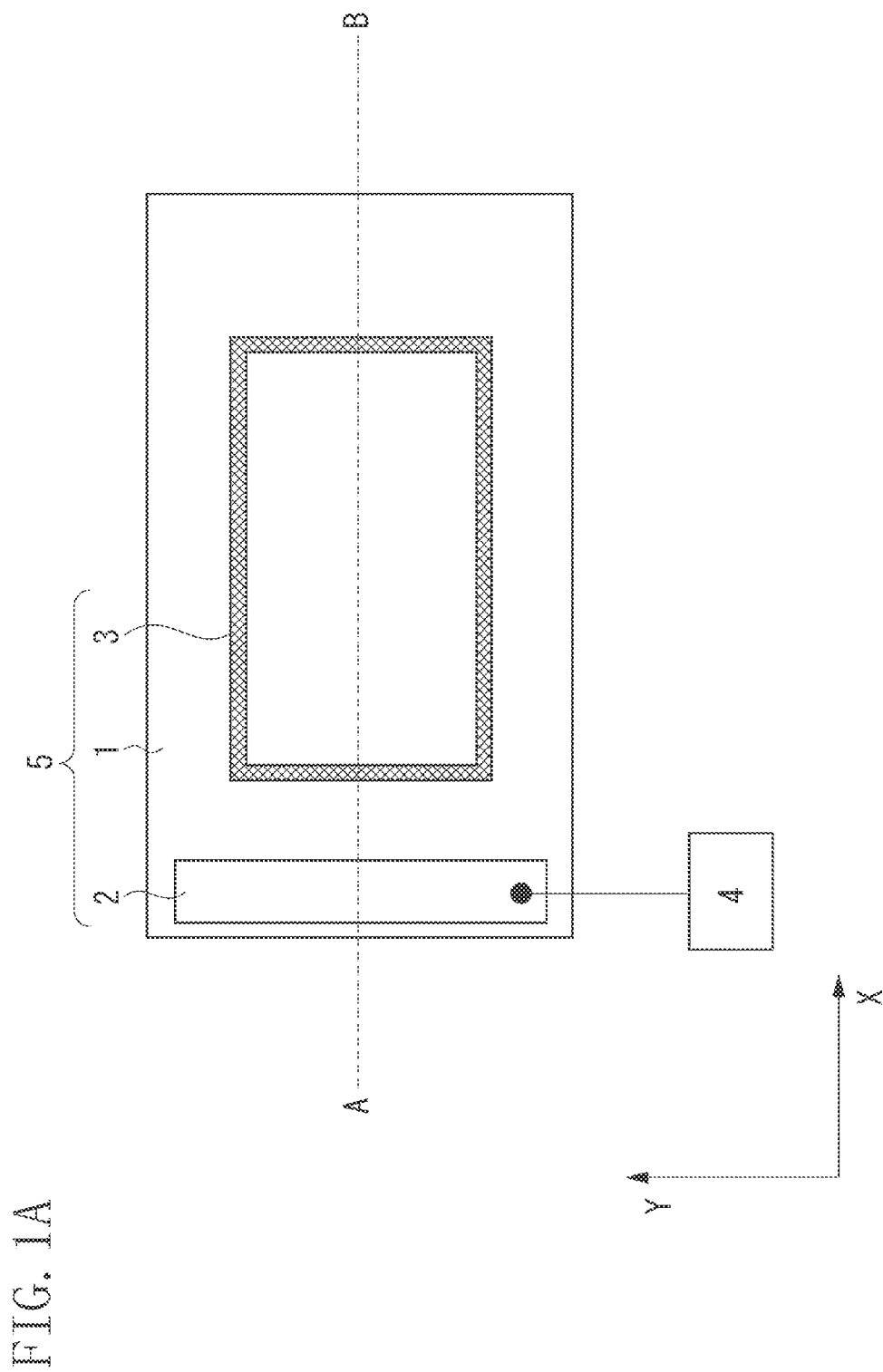

The dust removing apparatus according to the present exemplary embodiment is configured to use such the piezoelectric device. Specifically, the dust removing apparatus according to the present exemplary embodiment includes, as illustrated in FIGS. 1A and 1B, an optical member 1 serving as an elastic member, a piezoelectric element 2 serving as an electrical-mechanical energy conversion element, a supporting member 3, and a driving circuit 4. The optical member 1 is composed of an optical member with high transmittance such as a cover glass, an infrared cut filter, or an optical low pass filter. At an end portion of the optical member 1 in lengthwise direction, the piezoelectric element 2 is bonded, and they constitute a vibrator (piezoelectric device) 5 in conjunction with the supporting member 3. The supporting member 3 is fixed to the optical member 1 by an adhesive material.

Figure 1C:
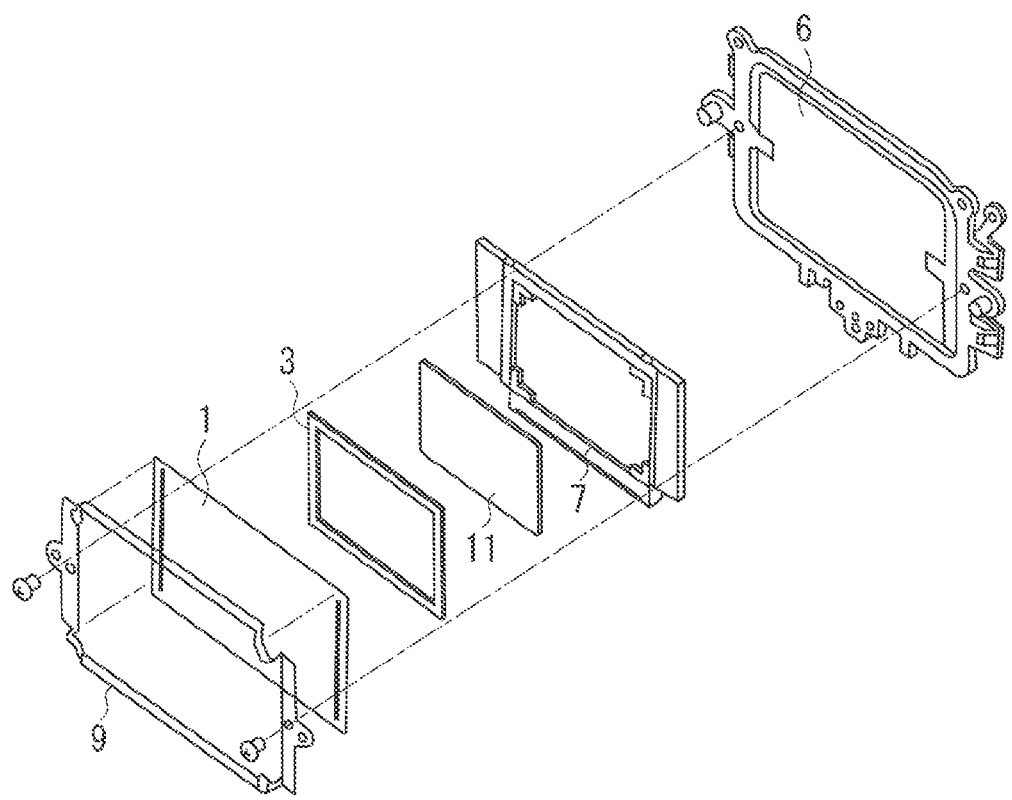
FIG. 1C is an exploded view of an imaging unit.

Further, as illustrated in FIG. 1C, an imaging unit includes at least the vibrator 5, a holding member 7, and an image sensor 6. The supporting member 3 performs a relative positioning between the holding member 7 and the optical member 1, and supports the optical member 1 to the holding member 7. The supporting member 3 can prevent external dust from invading into an optical path between the optical member 1 and the holding member 7. Further, as illustrated in FIG. 1C, on the image sensor 6 side of the optical member 1, another optical member 11 such as an optical low pass filter can be also provided as needed. In a case where another optical member 11 is provided on the image sensor 6 of the optical member 1, it maybe valuable to seal between the optical member 1 and another optical member 11 by the supporting member 3. The holding member 7 holds the optical member 1, but as described above, in a case where the optical member 11 different from the optical member 1 is provided, the holding member 7 may hold the optical member 1 via the different optical member 11. Further, the imaging unit can include an biasing means 9. By the biasing means 9, the optical member 1 can be urged toward the image sensor 6 side. Specifically, the biasing means 9 is formed as a single member by a material having spring property such as metals, and four corners of the optical member 1 are firmly fixed into four corners of the biasing means 9.

When an alternating voltage is applied to the piezoelectric element 2 by the driving circuit 4, the piezoelectric element 2 expands and contracts in an in-plane direction caused by the converse piezoelectric effect. Therefore, the optical member 1 which is bonded with the piezoelectric element 2 receives force expanding and contracting a bonded surface in a plane direction from the piezoelectric element 2, and standing-wave vibration is generated in such a manner as to periodically switch between convex and concave on the bonded surface side with the piezoelectric element 2. By setting a frequency of the alternating voltage in close proximity to a natural frequency of the vibrator 5, large amplitude can be obtained even by a small applied voltage, which is efficient. Further, a plurality of natural frequencies of the vibrator 5 exists, and when a voltage is applied at each natural frequency, the vibrator 5 can be vibrated in vibration modes with different orders from each other.

Figure 2A:
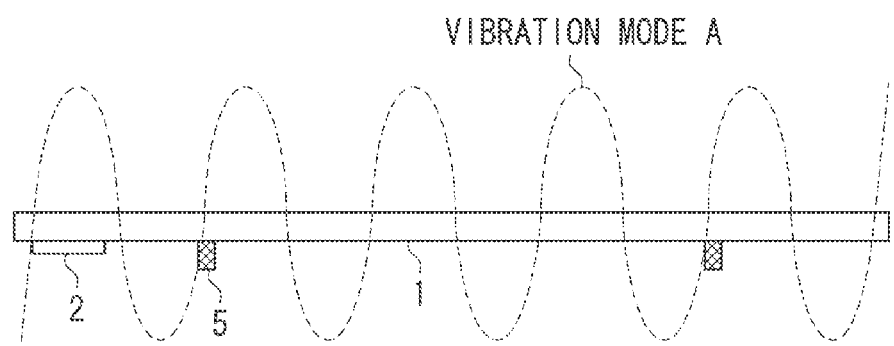
FIGS. 2A and 2B illustrate vibration modes of a vibrator in the dust removing apparatus.
Figure 2B:
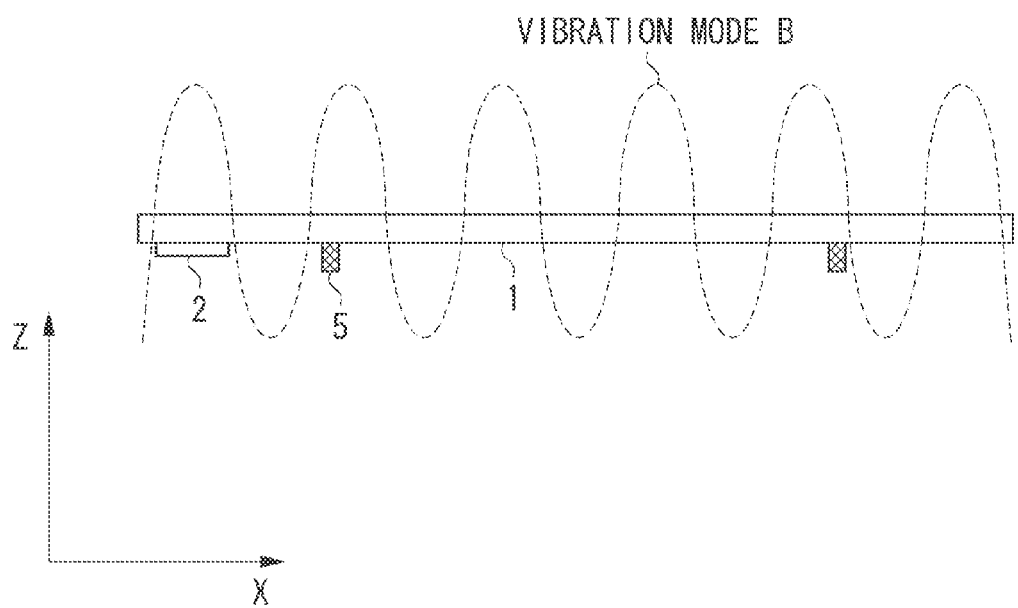

FIG. 2A and FIG. 2B illustrate displacement distributions in Z direction of a plane on opposite side to a plane on which the piezoelectric element 2 of the optical member 1 is bonded, of vibrations in vibration modes to be generated by the vibrator 5 caused by the piezoelectric element 2. By vibrations in a first vibration mode A or a second vibration mode B, when an acceleration equal to or greater than an adhesion force of the dust adhering to the optical member 1 is applied on the dust, the dust is peeled off from the optical member 1. In this way, by generating vibration in the first vibration mode A on the vibrator 5, the vibrator 5 has the function of peeling off the dust adhering to the optical member 1 of antinode positions of vibration in the first vibration mode A. Furthermore, by generating vibration in the second vibration mode B on the vibrator 5, the vibrator 5 has the function of peeling off the dust adhering to the optical member 1 in close proximity to nodes of vibration in the first vibration mode A. As described above, in order to remove the dust adhering to the surface of the optical member 1 it is necessary to exert acceleration equal to or greater than adhesion force. In a case of the same frequency, the acceleration is dependent on vibration amplitude. In other words, in a vibrator with the similar configuration, removing ability of the dust may well be determined depending on the vibration amplitude.

Figure 3:
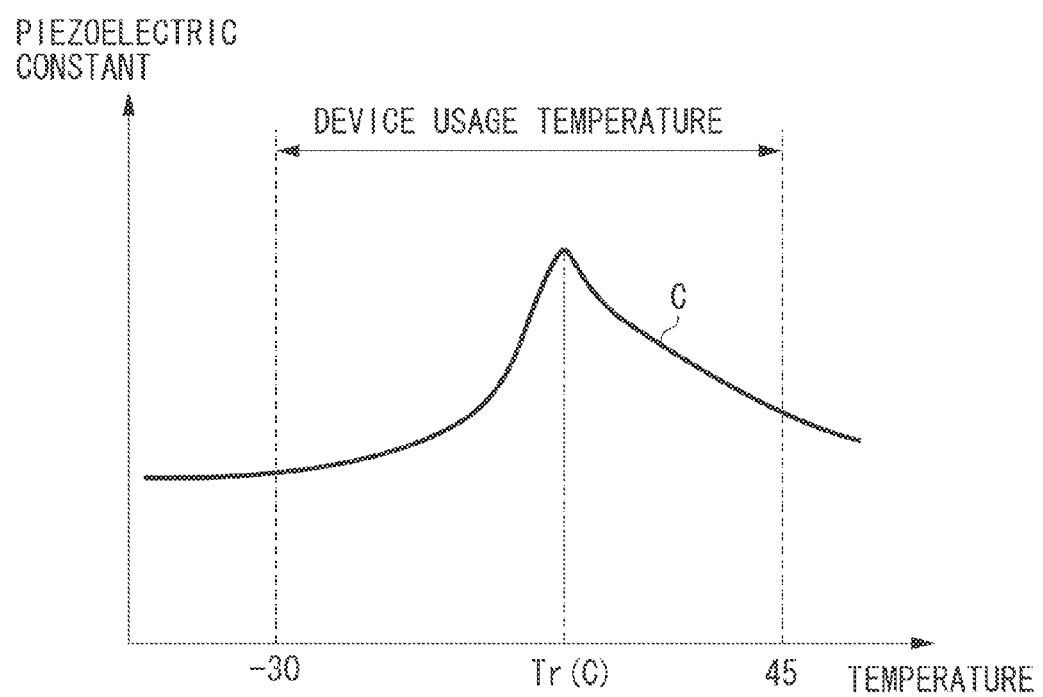
FIG. 3 illustrates a relationship between a piezoelectric constant and temperature of barium titanate.

The characteristics of the piezoelectric element 2 to be used in the present invention will be described with reference to FIG. 3. The piezoelectric element 2 is formed of ceramics containing barium titanate which is non-lead piezoelectric material as a main component. The barium titanate inherently has a phase transition temperature close to the room temperature (about 5° C.) at which crystal structure undergoes phase transition from orthorhombic to tetragonal, along with the increase in temperature. At the phase transition temperature, the piezoelectric constant becomes a local maximum value. On high temperature side, as the temperature of the barium titanate comes closer to the Curie temperature, the piezoelectric constant begins to decrease along with the temperature rise (FIG. 3, curve C). The piezoelectric constant is a constant representing a distortion of the piezoelectric element per electric field to be applied to the piezoelectric element. In other words, vibration amplitude of the vibrator 5 becomes large in the piezoelectric element with large piezoelectric constant. Therefore, at the phase transition temperature, vibration amplitude of the vibrator becomes a local maximum value, and further since the vibrator exhibits a steep change of vibration amplitude at the neighboring temperature, removing ability of dust will be subjected to substantial change.

Figure 4:
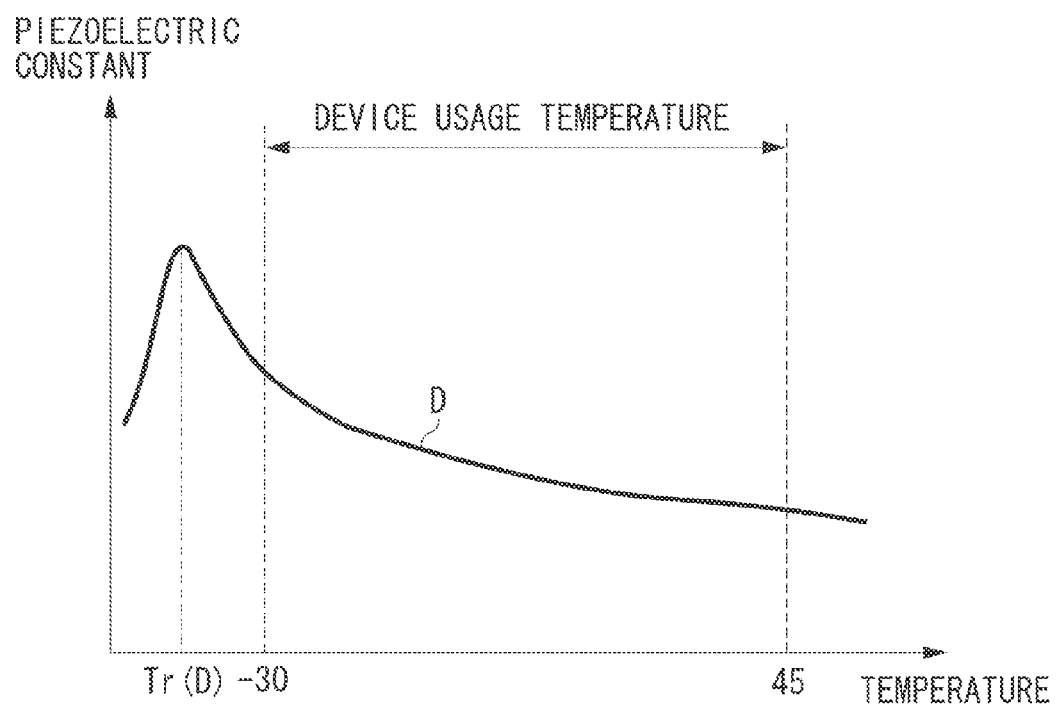
FIG. 4 illustrates a relationship between piezoelectric constant and temperature of a piezoelectric element serving as an electrical-mechanical energy conversion element in which calcium titanate is added to barium titanate according to the first exemplary embodiment of the present invention.

For this reason, in the present exemplary embodiment, a configuration for adding a minute amount of calcium titanate to barium titanate which is a main component as a material of the piezoelectric element serving as the electrical-mechanical energy conversion element, and shifting the phase transition temperature to below −30° C. in a usage temperature range of −30 to 45° C. of the vibrator 5 for use in general electronic devices is adopted. Through the configuration, the phase transition temperature illustrated in FIG. 3 is shifted to a region below −30° C., thereby in usage temperature range −30 to 45° C. of the vibrator 5, the piezoelectric constant decreases along with the rise in temperature, and it becomes possible to make the phase transition temperature not to exist (FIG. 4, curve D). Accordingly steep change of the dust removing ability of the vibrator 5 can be eliminated.

However, even if the phase transition temperature is shifted to a region below −30° C. in this way, the phase transition temperature exists near low temperature side of usage temperature range of the vibrator 5, and there arises an issue similar to the conventional example when the issue which the present invention intends to solve has been described. Such the issue will be further described, taking the setting of a voltage when the dust is removed as an example. In the curve D, the piezoelectric constant moderately decreases from low temperature to high temperature. At this time, vibration amplitude of the vibrator 5 also moderately decreases with temperature. For this reason, suppose that a voltage which allows desired dust removing performance at high temperature side be attained is set to the piezoelectric element, extra energy will be consumed on low temperature side as compared with the curve C in FIG. 3, which is not shifted as illustrated in FIG. 4. On the contrary, suppose that a voltage which allows desired dust removing performance on low temperature side is set to the piezoelectric element, performance cannot be satisfied on high temperature side. In order to deal with these, conventionally a temperature sensor has been provided near the vibrator, and it has been needed to control applied voltage or frequency depending on environment temperature.

Figure 5:
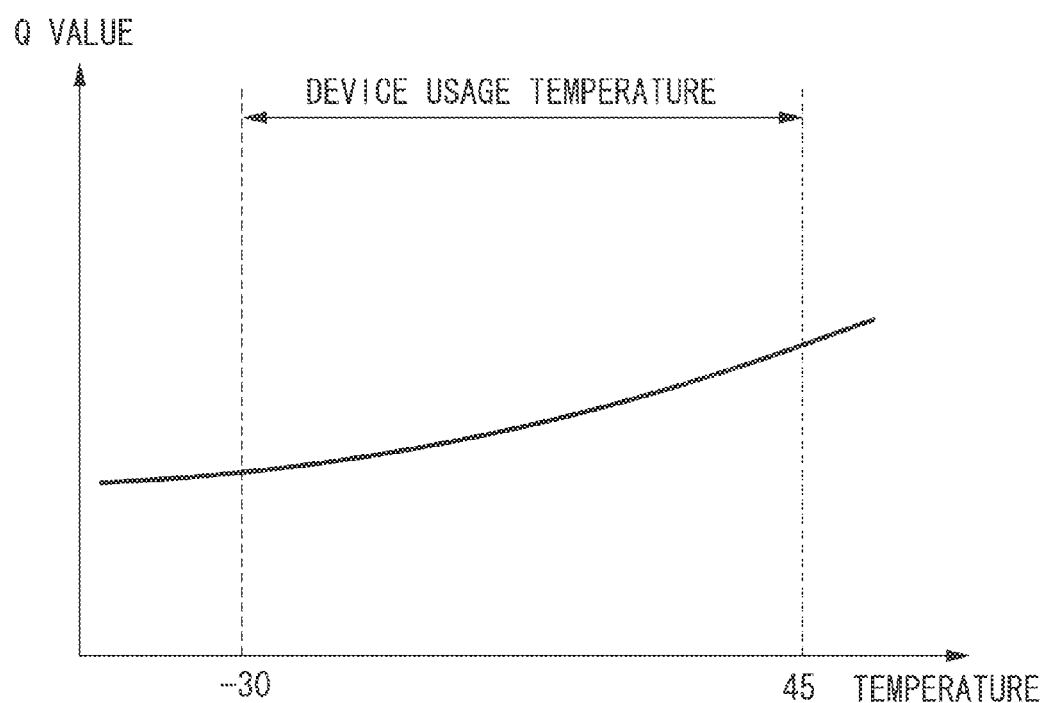
FIG. 5 illustrates a relationship between Q value and temperature of a vibrator according to the first exemplary embodiment of the present invention.

In contrast, in the present exemplary embodiment, without the need for a unit that detects temperature or displacement, a configuration which enables achieving enhancement of temperature stability is adopted by the unit as described in the following. In the present exemplary embodiment, a material in which Q value increases with temperature is used for the supporting member 3. Specifically, polymer materials such as foamed plastics or rubbers are used. The Q value is a constant representing a sharpness of mechanical vibration near resonance frequency when natural vibration is caused, and vibration amplitude in the resonance frequency becomes Q times as high as that in non-resonance state (static displacement). As a measuring method of Q value, for example, there is a methodology which uses an impedance analyzer. When an admittance near the resonance frequency of the piezoelectric element 2 in the vibrator 5, and a phase between current and voltage are measured with the impedance analyzer, and these are expressed with complex numbers, its real part becomes conductance, and its imaginary part becomes susceptance. When letting frequencies at which susceptance becomes local maximal and local minimal be f1 and f2 respectively, and frequency at which conductance becomes maximal be fs, then a value of fs/(f1−f2) becomes Q value. By measuring Q value of the vibrator 5 at each temperature, thereafter, by similarly measuring Q value at each temperature, in a state where the supporting member 3 is excluded from the vibrator 5, influence of the Q value of the supporting member 3 on the vibrator 5 can be known. As described above, the Q value of the supporting member 3 increases with temperature, and further the supporting member 3 is bonded to the optical member 1, and they constitute the vibrator 5 in conjunction with the piezoelectric element 2. As a result, the Q value of the vibrator 5 also increases along with the temperature rise. On the other hand, in the present exemplary embodiment, as described above, because the piezoelectric constant is configured to decrease with temperature rise, increased portion of vibration amplitude by the piezoelectric constant and decreased portion of vibration amplitude by the Q value get balanced each other out. Then, it becomes possible to reduce temperature change in vibration amplitude of the vibrator. The above relationship between Q value and temperature is illustrated in FIG. 5.

Figure 7:
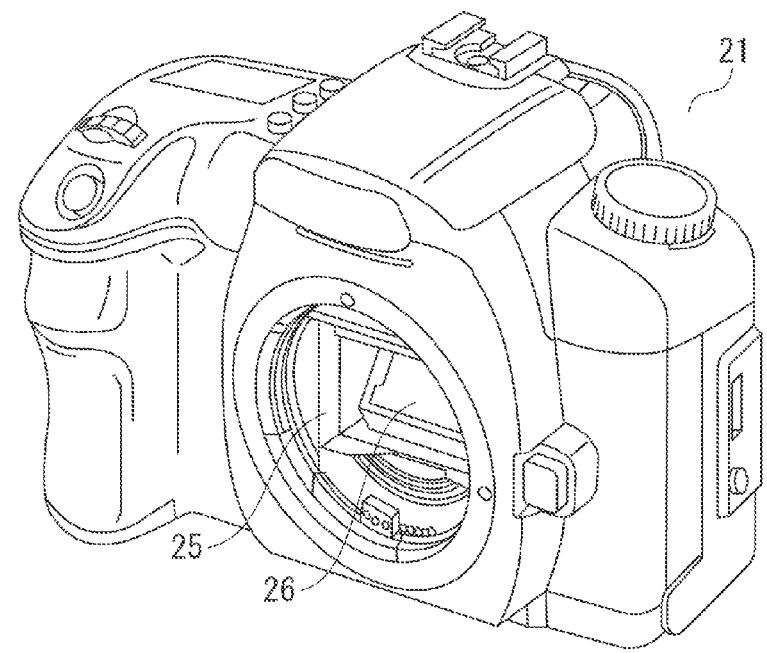
FIG. 7 is a schematic view of an imaging apparatus to which the present invention can be applied.
Figure 7:
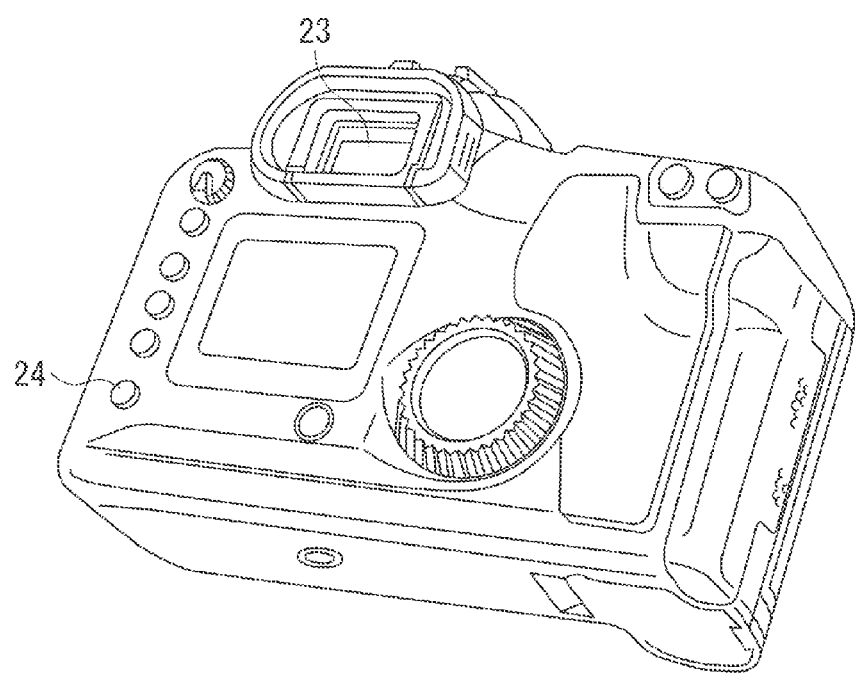

From the above, there can be selected a material of the supporting member 3 having variation of Q value with temperature, which would allow a value obtained by multiplying the piezoelectric constant of barium titanate by the Q value of the vibrator 5 to become always close to constant. In the present exemplary embodiment, reference to a case where a main component of the piezoelectric element 2 is barium titanate has been made. However, similar benefit can be expected even from a piezoelectric material similarly having a phase transition temperature near the room temperature, and enabling adjustment of the phase transition temperature, for example, a piezoelectric element serving as an electrical-mechanical energy conversion element containing sodium-potassium niobate as a main component. Further, the present invention can be applied to not only the dust removing apparatus, but also an actuator such as an ultrasonic motor and the like which use the piezoelectric material and driven at a frequency close to resonance frequency. Furthermore, the above-described dust removing apparatus can be used for the imaging apparatus. FIG. 7 is a front side perspective view when a digital single-lens camera as the imaging apparatus is viewed from an object side, in a state a photographic lens is removed (upper view), and a rear side perspective view (lower view) when the camera is viewed from a photographer side. Within a camera body 21 provided is a mirror box 25 by which a photographic light flux which has passed through the photographic lens (not illustrated) is guided, and a main mirror (quick return mirror) 26 is disposed within a mirror box 25. The imaging unit provided with the dust removing apparatus which has been described in the above-described exemplary embodiment is provided on a photographic optical axis which has passed through the photographic lens (not illustrated). The main mirror 26 can take a state where it is held at an angle of 45° relative to a photographic optical axis in order for a photographer to observe object image from a finder eyepiece window 23, and a state where it is held at a position retracted from the photographic light flux in order to guide the light flux in a direction of the image sensor. On the rear face of camera, a cleaning indicator switch 24 for driving the dust removing apparatus is provided, and when the photographer presses the cleaning indicator switch 24, it instructs the driving circuit to drive the dust removing apparatus.

Figure 6:
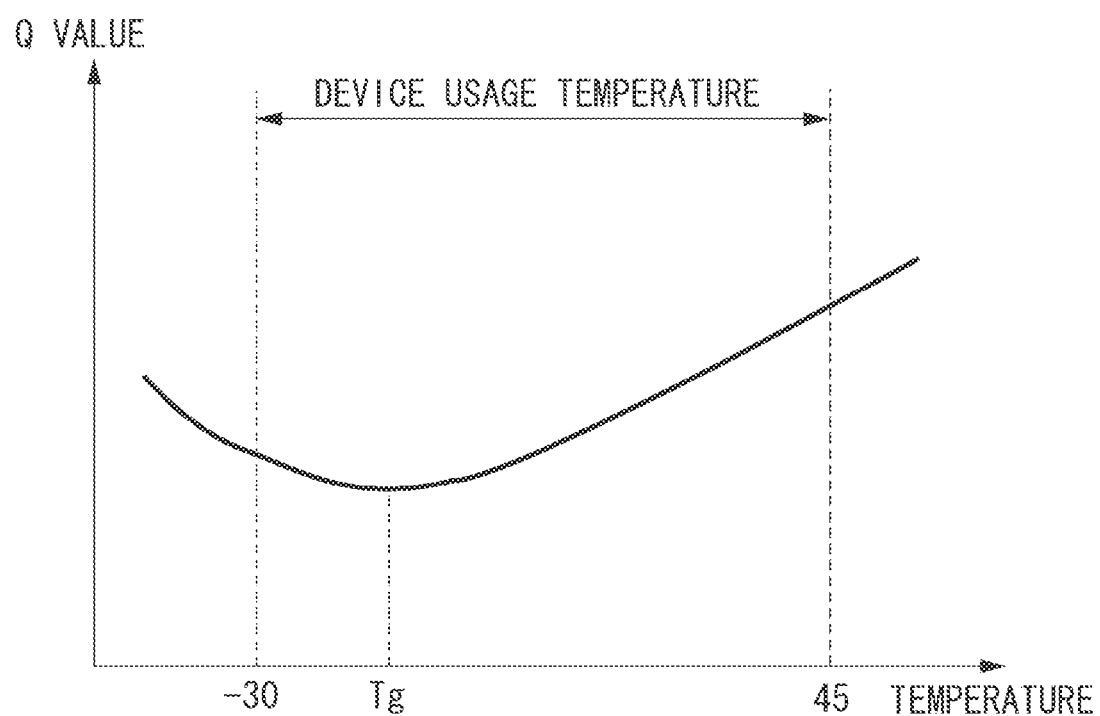
FIG. 6 illustrates a relationship between Q value and temperature of a vibrator according to a second exemplary embodiment of the present invention.

A second exemplary embodiment will be described. As the second exemplary embodiment, configuration example in which a configuration of the supporting member differs from that in the first exemplary embodiment will be described. In the present exemplary embodiment, except that a material having a glass transition temperature Tg in a driving temperature region (−30 to 45° C.) being usage temperature range of device is used for the supporting member 3, the configurations of the optical member 1, the piezoelectric element 2, and the driving circuit 4 are similar to those in the first exemplary embodiment. FIG. 6 illustrates a relationship between Q value and temperature of the vibrator 5 in the present exemplary embodiment. The glass transition temperature Tg is a temperature at which amorphous solid with low rigidity or viscosity, and high fluidity such as rubbers or foamed plastics used for the supporting member 3 is turned into a solid (glass state) which is rigid like crystal at low temperature and has a small fluidity. At the glass transition temperature Tg or lower, the Q value rises with drop of temperature. For this reason, vibration amplitude at a low temperature where the piezoelectric constant increases, will rise. However, since the Q value at a high temperature rises even in such a case, decreased portion of vibration amplitudes due to decrease in the piezoelectric constant at high temperature is canceled each other out, than a case where the Q value of the supporting member 3 is constant. Therefore, even in the configuration of the present exemplary embodiment the benefit of reducing variation of vibration amplitudes of the vibrator with temperature can be expected.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2011-230368 filed Oct. 20, 2011, Japanese Patent Application No. 2012-060202 filed Mar. 16, 2012, Japanese Patent Application No. 2012-177562 filed Aug. 9, 2012, and Japanese Patent Application No. 2012-188984 filed Aug. 29, 2012, each of which is hereby incorporated by reference herein in its entirety.

What is claimed is:

1. A piezoelectric device comprising:
an elastic member;
an electrical-mechanical energy conversion element fixed to the elastic member, configured to cause the elastic member to generate vibration; and
a supporting member that supports the elastic member,
wherein the electrical-mechanical energy conversion element comprises a piezoelectric material in which, in a usage temperature range of the piezoelectric device, a piezoelectric constant decreases along with temperature rise, and
wherein a supporting member that supports the elastic member comprises a material in which, in the usage temperature range of the piezoelectric device, Q value increases along with temperature rise.

2. A piezoelectric device comprising:
an elastic member;
an electrical-mechanical energy conversion element fixed to the elastic member, configured to cause the elastic member to generate vibration; and
a supporting member that supports the elastic member,
wherein the electrical-mechanical energy conversion element comprises a piezoelectric material in which, in a usage temperature range of the piezoelectric device, a piezoelectric constant decreases along with temperature rise, and
wherein a supporting member that supports the elastic member comprises a material in which:
a glass transition temperature is in a usage temperature range; and
in a region on a low temperature side of the usage temperature range of the piezoelectric device, Q value increases along with temperature drop.

3. The piezoelectric device according to claim 1, wherein the electrical-mechanical energy conversion element comprises a piezoelectric material of which main component is barium titanate or sodium-potassium niobate.

4. The piezoelectric device according to claim 1, wherein the supporting member comprises polymer material.

5. A dust removing apparatus comprising:
the piezoelectric device according to claim 1; and
a driving circuit configured to apply an alternating voltage to the electrical-mechanical energy conversion element,
wherein removing dusts adhering to the elastic member is performed by vibration generated on the elastic member by application of the alternating voltage.

6. An imaging apparatus comprising:
the dust removing apparatus according to claim 5; and
an image sensor provided at a position on which a light flux which has passed through the elastic member of the dust removing apparatus is incident.

7. The piezoelectric device according to claim 2, wherein the electrical-mechanical energy conversion element comprises a piezoelectric material of which main component is barium titanate or sodium-potassium niobate.

8. A dust removing apparatus comprising:
the piezoelectric device according to claim 2; and
a driving circuit configured to apply an alternating voltage to the electrical-mechanical energy conversion element,
wherein removing dusts adhering to the elastic member is performed by vibration generated on the elastic member by application of the alternating voltage.

9. An imaging apparatus comprising:
the dust removing apparatus according to claim 8; and
an image sensor provided at a position on which a light flux which has passed through the elastic member of the dust removing apparatus is incident.

10. The piezoelectric device according to claim 1, wherein a value obtained by multiplying the piezoelectric constant of the piezoelectric material by a Q value of the vibrator is close to constant in the usage temperature range.

11. The piezoelectric device according to claim 2, wherein a value obtained by multiplying the piezoelectric constant of the piezoelectric material by a Q value of the vibrator is close to constant in the usage temperature range.

* * * * *